United States Patent [19]

Sigusch et al.

[11] Patent Number: 4,588,379

[45] Date of Patent: May 13, 1986

[54] CONFIGURATION FOR TEMPERATURE TREATMENT OF SUBSTRATES, IN PARTICULAR SEMI-CONDUCTOR CRYSTAL WAFERS

[75] Inventors: Reiner Sigusch, Munich; Ludwig Wipper, Germering, both of Fed. Rep. of Germany

[73] Assignee: Siemens Aktiengesellschaft, Berlin and Munich, Fed. Rep. of Germany

[21] Appl. No.: 576,299

[22] Filed: Feb. 2, 1984

[30] Foreign Application Priority Data

Feb. 21, 1983 [DE] Fed. Rep. of Germany ....... 3305934

[51] Int. Cl.[4] .............................................. F24J 3/00
[52] U.S. Cl. .................................... 432/231; 432/232
[58] Field of Search ............... 432/230, 231, 232, 37; 118/59; 219/428, 445, 446; 414/147

[56] References Cited

U.S. PATENT DOCUMENTS 3,540,704 11/1970 Wilson et al. .................. 432/230 X
4,445,850 5/1984 Hansen, Jr. et al. ........... 432/230 X
4,531,909 7/1985 Takeshita .............................. 432/37

Primary Examiner—Edward G. Favors
Attorney, Agent, or Firm—John Francis Moran

[57] ABSTRACT

Configuration for temperature treatment of substrates, in particular semiconductor crystal wafers, comprised of a carrier for receiving the substrates to be treated, a frame-like support for receiving the carrier, whereby the frame-like support is connected to a time-controlled compressed air cylinder and can be shifted in axial direction by means of a roller guide, as well as heating devices. The heating devices are connected to a vacuum suction configuration, and includes one, disk-shaped heating plate with a flute type opening on top, to which the substrates contained in carrier are vacuum sucked. The configuration is used for low temperature processes used in conjunction with semiconductor technology, especially photolithographic processes, and eliminates unnecessary reloading or other rearranging procedures.

13 Claims, 4 Drawing Figures

CONFIGURATION FOR TEMPERATURE TREATMENT OF SUBSTRATES, IN PARTICULAR SEMI-CONDUCTOR CRYSTAL WAFERS

BACKGROUND OF THE INVENTION

The invention relates to an apparatus for temperature treatment of substrates, in particular, of semi-conductor crystal wafers, processed e.g. in the course of integrated circuit production.

As part of the process of integrated circuit fabrication, photolithographic procedures are applied to produce submicrometric structures on substrates such as mono crystalline silicon wafers. For that purpose, the substrate is cleaned and, if necessary, heated, so that the substrate surface is free of deposits. In addition, a surface treatment is performed to improve the adhesion of a photoresist coating which is applied to the substrates. When the substrates have been coated with photosensitive material known as photoresist, they are baked at a temperature of e.g. 85° C. to evaporate the greatest portion of the photoresist solvent vehicle. After the exposure process and prior or subsequent to the development of the structures produced on the substrate, the photoresist layers undergo various temperature treatments.

Normally, temperature treatments of this type are performed by heating the substrates in a convection oven or by directing heat through inductive heating to the front or back surface of the substrate wafers. As an additional possibility for pre or postbaking substrate wafers layered with photosensitive material, the back of the crystal wafer can be thermally contacted. For these conduction heating, the semi-conductor crystal wafers coated with photoresist can be processed both individually or in cassettes either manually or automatically through the prebake process.

SUMMARY OF THE INVENTION

It is an object of the present invention to streamline the temperature treatment processes included in the photolithographic technology applied during the production of integrated semiconductor devices, and to delete or avoid the steps of reloading or rearranging the substrates between individual processing steps. In addition, extraordinarily clean processing procedures are established by the present invention, which prevent deposits of photosensitive material or metal particles which may be caused by abrasions. Deposited particles and/or metalic impurities lead to defective structures and consequently to reduced production yields.

The objectives according to the invention are met by providing a configuration of the type discussed above, which is characterized by the following:

(a) a carrier, in which the substrates are arranged;
(b) a frame-like support, receiving the carrier with the substrates, whereby the support is connected with a time-controlled compressed air cylinder and can be shifted in axial direction by means of a guide;
(c) a temperature controlled heating device arranged below the frame-like support for holding the carrier; and
(d) a vacuum suction device connected with the heating device.

According to a further embodiment of the invention, the carrier for receiving the substrates can be provided with circular recesses adapted to the diameter of the substrates, whereby these circular recesses have been provided with means to position the substrates therein. These means can be realized by holding pins which have been symmetrically arranged along the edges of the circular recesses, or by a ring-shaped support arranged at the edges of the circular recesses.

In order to lock the carrier containing the substrates in the horizontal (x/y) direction, positioning pins for the prism-shaped recesses in the carrier are arranged on one side of the frame-shaped support, while a wedge-shaped positioning element is located on the opposite side of the support.

According to the number of substrates arranged in the carrier, the heating device includes disk-shaped, individually controllable heating plates adjusted to the measurements of the substrates. The contact surfaces of these heating plates have been provided with a layer of hard aluminum coating to avoid abrasion.

In order to ensure that the substrates contact the heating plates in an optimal manner, the disk-shaped heating plates have been provided with flute type openings for vacuum suction. By means of the vacuum suction, the substrates are sucked onto the heating plates, so that a very good reproducable heat transfer is established within 2 seconds. The time during which the substrates are placed against the heating plates is automatically controlled with an absolute precision of less than 1 sec. (the baking time is approx. 1 minute).

The configuration can be applied with all low temperature processes (up to 400° C.).

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
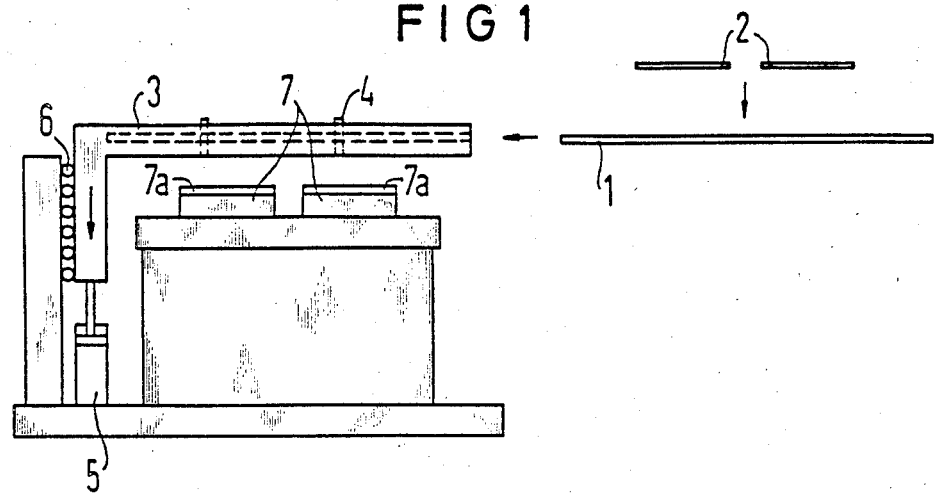
FIG. 1 is a diagrametic sketch of a side view of the apparatus according to the invention.

The following definitions are applicable to the drawings:

1 = carrier
2 = substrate, e.g. a semi-conductor crystal wafer
3 = frame-shaped support
4 = positioning pin in the frame-shaped support
5 = time-controlled air compressed cylinder
6 = roller guide
7 = heating devices including disk-shaped, individually controllable heating plates 7a
8 = flute type openings for vacuum suction
9 = holding pins for the crystal wafers in the carrier (1)
10 = prism-shaped recesses in the carrier to lock the support (3) into position by means of positioning pins (4),
11 = wedge-shaped positioning element in the frame-shaped support.

Figure 2:
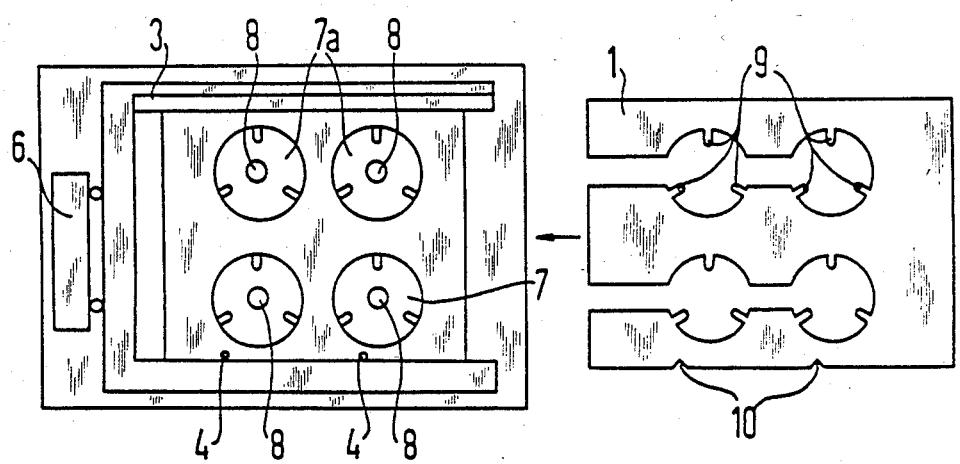
FIG. 2 is a top view of the apparatus of FIG. 1.
Figure 3:
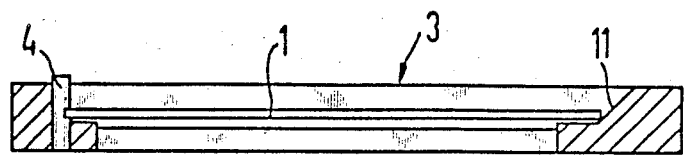
FIG. 3 is a cross-section of the support (3) holding the carrier (7).
Figure 4:
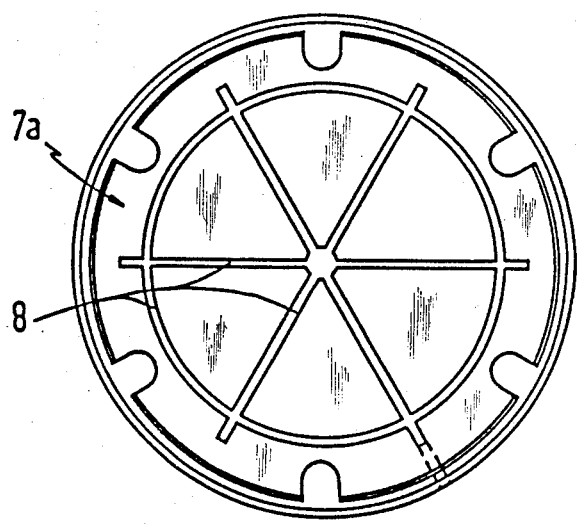
FIG. 4 is a top view of the heating plates (7a) with the flute-type openings (8) for vacuum suction.

FIG. 2 shows the best view of the apparatus including four heating devices (7). This arrangement can be realized in conjunction with a commercially available quadruple centrifuge (type AC 201 manufactured by Headway, Garland, USA). The quadruple structure of the carrier enables the use of the same carrier for coating and baking the crystal wafers, thus eliminating reloading or other rearranging procedures.

The steps required for prebaking are as follows:
1. Move carrier (1) on the photoresist spinner and begin with the automatic placement of the semiconductor crystal wafers (not shown).
2. Insert carrier (1, 2) with substrates into the support (3) of the baking apparatus.
3. Activate starter button.
4. Allow the crystal wafers to be placed pneumatically onto the heating plates (7a). Further contact is established by means of vacuum suction (8).
5. After the drying time is completed, which has been set prior to activating the start button, the dried wafers are lifted off the heating plates automatically.
6. Remove carrier crystal wafers (1, 2) from support (3).

There has thus been shown and described a novel apparatus for temperature treatment of substrates which fulfills all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:
1. Configuration for temperature treatment of planar substrates, in particular semiconductor crystal wafers comprising:
    (a) a carrier for storing said substrates therein;
    (b) a frame-like support for receiving said carrier, said support being connected to a time-controlled compressed air cylinder and being shiftable by means of a roller guide in a direction normal to a first plane corresponding to the surface of said planar substrate;
    (c) a temperature controlled heating device arranged below said frame-like support which holds said carrier; and
    (d) a vacuum suction configuration connected with said heating devices.

2. Configuration according to claim 1, wherein said carrier for receiving said substrates further comprises circular-shaped recesses adapted in size to the diameter of said substrates, said recesses being provided with means for holding said substrates in position in said circular-shaped recesses and wherein prism-shaped recesses have been arranged on one side of said carrier which aid in the directional positioning of said carrier in said support.

3. Configuration according to claim 2, further comprising positioning pins for said prism-shaped recesses to lock said carrier in a position to prevent lateral shifting in the first plane, said pins being arranged on one side of said support, said configuration further comprising a wedge-shaped positioning element which is arranged on the side of said support which is opposite said positioning pins.

4. Configuration according to claim 2, further comprising symmetrically arranged holding pins for said substrates, said holding pins being located at an edge of said circular recess in said carrier.

5. Configuration according to claim 3, further comprising symmetrically arranged holding pins for said substrates, said holding pins being located at an edge of said circular recess in said carrier.

6. Configuration according to claim 2, further comprising ring-shaped supports in said circular recesses of said carrier to support said substrates.

7. Configuration according to claim 3, further comprising ring-shaped supports in said circular recesses of said carrier to support said substrates.

8. Configuration according to claim 1, wherein each said heating device includes a disk-shaped heating plate, each one of said plates being individually controllable and adjusted to the measurements of said substrates.

9. Configuration according to claim 8, wherein four heating plates are provided.

10. Configuration according to claim 8, wherein the contact surface of said heating plates and the surface of said carrier are provided with a layer of hard aluminum coating.

11. Configuration according to claim 1, wherein flute type openings have been provided in said disk-shaped heating plates for vacuum suction.

12. Configuration according to claim 8, wherein flute type openings have been provided in said disk-shaped heating plates for vacuum suction.

13. Configuration according to claim 1, further comprising means for enabling the setting of an automatic control in said heating device with respect to the time said substrates remain subjected to said heating device.

* * * * *